United States Patent [19]

Shiraki et al.

[11] Patent Number: 4,484,210

[45] Date of Patent: Nov. 20, 1984

[54] SOLID-STATE IMAGING DEVICE HAVING A REDUCED IMAGE LAG

[75] Inventors: Hiromitsu Shiraki; Nobukazu Teranishi; Yasuo Ishihara, all of Tokyo, Japan

[73] Assignee: Nippon Electric Co., Ltd., Tokyo, Japan

[21] Appl. No.: 297,759

[22] Filed: Aug. 31, 1981

[30] Foreign Application Priority Data

Sep. 5, 1980 [JP] Japan .................................. 55-123258
Sep. 5, 1980 [JP] Japan .................................. 55-123259
Oct. 2, 1980 [JP] Japan .................................. 55-138026

[51] Int. Cl.$^3$ ...................... H01L 29/78; H01L 27/14; H01L 31/00
[52] U.S. Cl. ........................................ 357/24; 357/30; 357/89
[58] Field of Search ................................ 357/24 LR, 30

[56] References Cited

U.S. PATENT DOCUMENTS 3,995,302 11/1976 Amelio ........................... 357/24 LR
4,155,094 5/1979 Ohba et al. ..................... 357/24 LR
4,385,307 5/1983 Suzuki ........................... 357/24 LR Primary Examiner—Gene M. Munson
Attorney, Agent, or Firm—Laff, Whitesel, Conte & Saret

[57] ABSTRACT

A solid-state imaging device has a semiconductor substrate of one conductive type. A plurality of light-charge converter regions, of the opposite conductivity type, are formed in the semiconductor substrate. A charge-voltage converter region, formed in the semiconductor substrate, converts the electric charge produced by the light-charge converter regions into a voltage. At least one charge transfer section is formed in the semiconductor substrate for transferring the electric charge produced by the light-charge converter regions to the charge-voltage converter region. At least one charge transfer gate section is in the semiconductor substrate and has a gate electrode for controlling the timing of a transfer of the electric charges from the light-charge converter regions to the charge transfer section. Pulses are generated with a predetermined pulse potential and applied to the gate electrode in the charge transfer gate section. The predetermined pulse potential has the relationship $$V_B + 2\phi_{FP} < V_{TG\ sub}$$

where; $V_B$ represents a voltage which completely depletes the light-charge converter region; $\phi_{FP}$ represents a difference between a Fermi level of the semiconductor substrate not containing an impurity; and $V_{TG\ sub}$ represents a potential generated at the semiconductor substrate in the charge transfer gate section by the mentioned pulse.

1 Claim, 16 Drawing Figures

SOLID-STATE IMAGING DEVICE HAVING A REDUCED IMAGE LAG

BACKGROUND OF THE INVENTION

The present invention relates to a solid-state imaging device, and more particularly to a solid-state imaging device making use of a charge coupled device (hereinafter abbreviated as CCD).

Recently, a one-dimensional image sensor making use of silicon has come into practical use. A two-dimensional device is also coming into practical use in place of the vidicon type imaging tube in the prior art. However, there still remain a few shortcomings in such a solid-state image sensor. An image lag, as will be described below, is one of the shortcomings of the solid-state image sensor.

The problem of image lag in the solid-state image sensor is especially liable to arise in an interline system CCD sensor. Generally, among the solid-state image sensors, an image sensor making use of a CCD has a low noise because of its small output capacitance. Hence, it can achieve imaging under a low illuminance. However, in the interline system CCD sensor, the proportion of the intensity of imaging lag relative to the original image intensity is increased as illuminance is lowered. This increased lag image intensity deteriorates the quality of the reproduced picture. Accordingly, the limit of usable low illuminance is determined not by a noise but by the effect of the image lag. Thus, if the image lag is reduced, the lower limit of usable illuminance can be widely extended to thereby enable imaging at lower light levels.

Now the mechanism which causes a generation of the image lag will be explained.

The solid-state imaging device in the prior art includes a plurality of N+-type photo-sensitive regions in a P-type silicon substrate. The N+-type photo-sensitive regions are formed in at least one column. In a two-dimensional image sensor, they are formed in a plurality of columns. The imaging device also includes CCD charge transfer sections parallel with the respective columns. The charge transfer between the CCD charge transfer sections and the corresponding columns of photo-sensitive regions is controlled by applying given potentials to gate electrodes provided therebetween.

It should be noted that the N+-type photo-sensitive regions forms a well of a potential by a built-in-potential of the PN-junction between that region and the P-type silicon substrate. Thus, the electric charge produced by incident light to the N+-type photo-sensitive region is accumulated in this potential well. In response to an application of a potential to the gate electrode, the electric charge accumulated in this potential well is transferred to the CCD charge transfer section. During this transfer process, the transfer of the electric charge is initially effected quickly because the charge accumulated in the potential well is so great that the potential well is held at a sufficiently low potential, as compared to the potential at the point below the gate electrode. Eventually, however, the potential at the potential well gradually approaches the potential under the gate electrode. Hence, the speed of transfer of electric charge is gradually slowed. As a result, during a predetermined period when a given potential is applied to the gate electrode, the electric charge accumulated in the N+-type photo-sensitive region cannot be completely transferred to the CCD charge transfer section. Therefore, a part of the accumulated electric charge remains in the N+-type photo-sensitive region. This residual electric charge is read out when a given potential is subsequently applied to the gate electrode. As a result, an image lag appears in the reproduced picture image.

SUMMARY OF THE INVENTION

It is an object of the present invention to provide a solid-state imaging device having an extremely reduced image lag.

According to one feature of the present invention, there is provided a solid-state imaging device having a semiconductor substrate of one conductivity type. A plurality of light-charge converter regions of the opposite conductivity type is formed in the semiconductor substrate. A charge-voltage converter region is also formed in the semiconductor substrate for converting the electric charge produced by the light-charge converter regions into a voltage. At least one charge transfer section is formed in the semiconductor substrate for transferring the electric charge produced by the light-charge converter regions to the charge-voltage converter region. At least one charge transfer gate section has a gate electrode adapted to control the timing for transferring the electric charges from the light-charge converter regions to the charge transfer section.

A pulse generating means is provided for applying pulses having a predetermined pulse potential to the gate electrode in the charge transfer gate section. The predetermined pulse potential is selected such that the relationship of $$V_B + 2\phi_{FP} < V_{TGsub}$$

is satisfied where 1 $V_B$ represents a voltage which can completely deplete the light-charge converter region; $\phi_{FP}$ represents a difference between a Fermi level of the semiconductor substrate in the charge transfer gate section and a Fermi level of the semiconductor substrate not containing an impurity; and $V_{TGsub}$ represents a potential generated at the semiconductor substrate in the charge transfer gate section by the above mentioned pulse.

The plurality of light-charge converter regions are arranged in one column in a one-dimensional line sensor, while they are arrayed in a plurality of columns in a two-dimensional area sensor. Preferably the charge transfer section is formed of CCD elements with a plurality of electrode parts, each consisting of two kinds of electrodes having mutually different threshold values, are formed in a column on the semiconductor substrate. The gate electrode in the charge transfer gate section can be provided either separately from the electrodes in the charge transfer section or contiguously to a predetermined one of the electrodes in the charge transfer section. In the latter case, it is necessary for the threshold value of the charge transfer gate section to be higher than the threshold value of the contiguous charge transfer section. Moreover, the surface of the light-charge converter region can be provided with a region of one conductivity type that is contiguous to the semiconductor substrate. This region is for increasing a charge accumulation capacity.

According to the present invention, the relationship of $V_B + 2\phi_{FB} < V_{TGsub}$ is satisfied. The charges accumulated in the light-charge converter region are all transferred at a high speed to the charge transfer section.

This high speed charge transfer is uniformly carried out even when only a small quantity of charge is accumulated in the light-charge converter region. Accordingly, in response to a single pulse applied to the gate electrode in the charge transfer gate section, the charges accumulated in the light-charge converter region can be entirely transferred to the charge transfer section. An image lag does not appear subsequently. As described above, according to the present invention, a solid-state imaging device that is free from an image lag can be provided with an extremely simple structure.

BRIEF DESCRIPTION OF THE DRAWINGS

The above and further objects, features and advantages of the present invention will become more apparent from the following detailed description of the invention taken in conjunction with the accompanying drawings, wherein:

FIG. 1 is an illustration of a solid-state imaging device in the prior art;

FIG. 3 is an illustration of a first preferred embodiment of the solid state imaging device of the present invention;

FIG. 5 is an illustration of a second preferred embodiment of the present invention;

DETAILED DESCRIPTION OF THE INVENTION

Figure 1A:
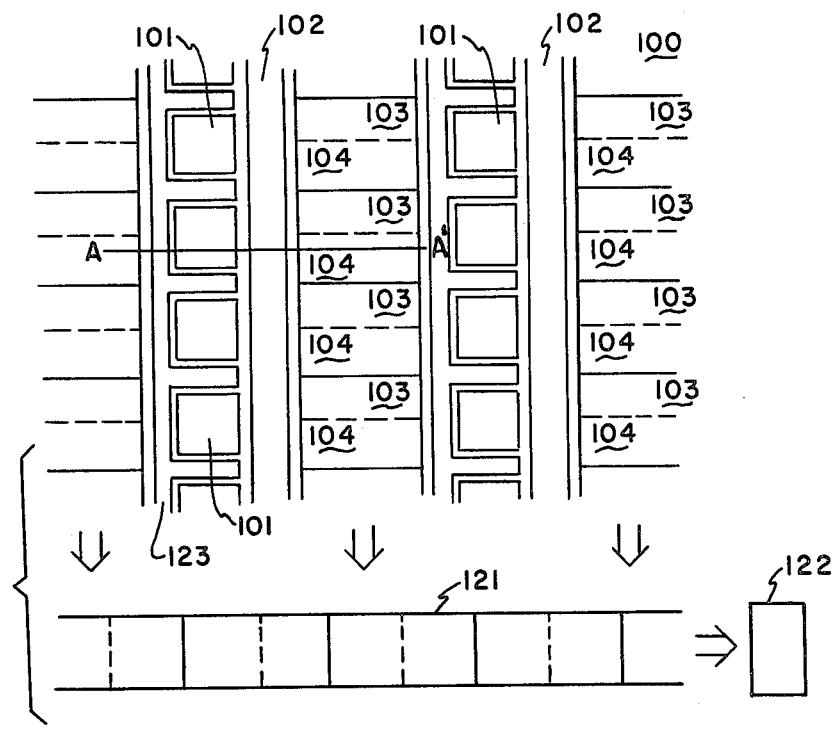
FIG. 1(a) is a schematic plan view for illustrating a two-dimensional construction of the device.
Figure 1B:
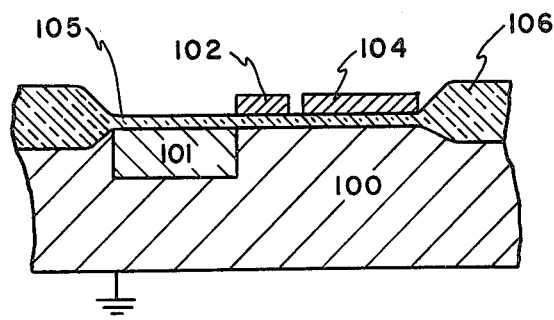
FIG. 1(b) is a cross-sectional view taken along line A—A' in FIG. 1(a)
Figure 1C:
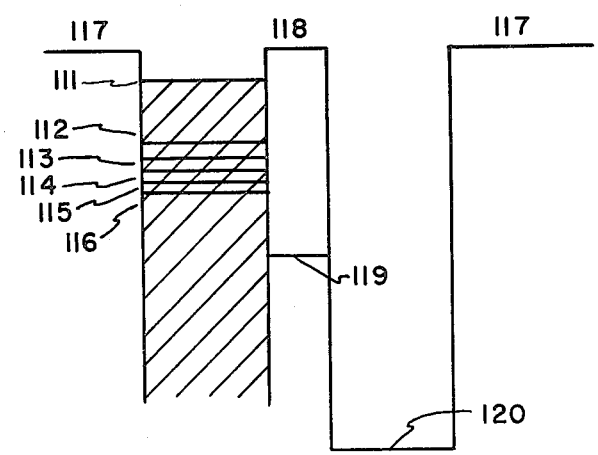
FIG. 1(c) is a diagram showing a potential distribution in a semiconductor substrate portion corresponding to that shown in FIG. 1(b)

FIGS. 1(a), 1(b) and 1(c) illustrate an interline system CCD sensor in the prior art. A construction of the device is schematically shown in FIG. 1(a).

With reference to these figures, a plurality of N+-type light-charge converter regions 101 are formed in a P-type silicon substrate 100 as arranged in a matrix form. Gate electrodes 102 are formed along the respective columns of the light-charge converter regions 101 for controlling charge transfer. As shown in FIG. 1(b), the gate electrode 102 is formed on an oxide film 105 and is isolated from the silicon substrate 100. A member of CCD charge transfer sections are formed in parallel to each gate electrode 102. These CCD charge transfer sections, are alternately arrayed barrier region electrodes 103 and accumulation region electrodes 104. The CCD charge transfer section may be driven by two-phase pulses. The barrier region electrodes 103 and the accumulation region electrodes 104 are both formed on the oxide film 105 above the silicon substrate 100 as shown in FIG. 1(b). However, the thickness of the oxide film 105 under the barrier region electrode 103 is made larger than the thickness of the oxide film 105 under the accumulation region electrode 104. Each light-charge converter region 101 is surrounded by a channel stopper 123 except for its surface opposite to the accumulation region electrode 104. The channel stopper 123 may consist of either a thick oxide film 106 or a high impurity concentration region of the same conductivity type as the semiconductor substrate 100.

Electric charges accumulated in the light-charge converter region 101 are transferred to the portion of the CCD charge transfer section which is directly under the accumulation region electrode 104. After the pulse applied to the gate electrode 102 has disappeared, every barrier region electrode 103 and adjacent accumulation region electrode 104 are paired. Pulse signals having phases which are opposite to each other are applied to the alternate pairs, so that the electric charges are transferred along the CCD charge transfer section to a horizontal shift register section 121. The horizontal shift register section 121 has a construction similar to the CCD charge transfer section. The charge arriving at the horizontal shift register section 121 is transferred to a charge-voltage converter section 122, at a higher speed. In the charge-voltage converter section 122, the charges are converted into a voltage proportional to the quantity of charges, and the voltage signal is the output from this section 122. The above-described scanning operation is repeated subsequently for the two-dimensionally arrayed light-charge converter regions 101.

FIG. 1(b) shows one unit cell in th CCD image sensor of FIG. 1(a) and the respective portions thereof are denoted by the same reference numerals that are used in FIG. 1(a). More particularly, a P-type silicon substrate 100 is provided with N-type light-charge converter regions 101, gate electrodes 102, accumulation region electrodes 104 and barrier region electrodes 103 (not shown), on a thin oxide film 105 of 500 to 2000 Å in thickness, adjacent to the light-charge converter regions 101. In the opposite side edge portions of the unit cell are a thick oxide film 106 of 3000 to 10000 Å in thickness.

FIG. 1(c) shows a potential profile on a silicon substrate 100 in one unit cell as illustrated in a corresponding manner to FIG. 1(b). In this diagram, a potential is taken along an ordinate so that the potential may be increased downwardly. A potential 117 is the potential at the substrate, which is equal to the ground potential and will be hereinafter represented by $\psi_{TP}$. Potentials 111–116 are the potentials at the light-charge converter region 101 when different quantities of electric charges are accumulated on the region 101. The potentials 111, 112, ..., 116, respectively, correspond to successively increased quantities of electric charges. These potentials at the light-charge converter region 101 are hereinafter identified by $\psi_{N+}$. A potential 118 is the potential of the substrate 101 under the gate electrode 102 in the charge transfer gate section when a pulse signal is not applied to the gate electrode 102. A potential 119 is the potential of the gate electrode 102 when a pulse signal is applied thereto. The potential 118 or 119 is hereinafter represented by $\psi_{TG}$. A potential 120 is the potential of the accumulation region electrode 104 in the CCD charge transfer section when a voltage is externally applied thereto. This potential is hereinafter represented by $\psi_{CCD}$.

Figure 2:
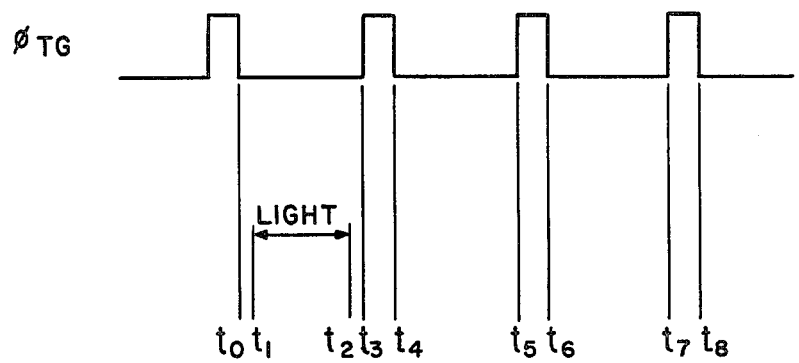
FIG. 2 is a timing chart showing timing of pulses applied to a gate electrode in a charge transfer gate section.

FIG. 2 shows a pulse signal waveform $\phi_{TG}$ applied to the gate electrode 102. Now the mode of charge transfer from the light-charge converter region 101 to the substrate portion under the accumulation region electrode 104 in the prior art will be explained with reference to FIGS. 1(c) and 2, together. Here it is assumed that the light-charge converter region 101 is irradiated by incident light only during the period between time $t_1$ and time $t_2$. The following description explains the reason why an image lag is produced.

During the period of time $t_0$ to $t_3$, the pulse signal $\phi_{TG}$ is in an OFF condition (assumed to be 0 volt) and the potential $\psi_{TP}$ and the potential $\psi_{TG}$ are both close to 0 volt. The following description assumes that all three of these potentials are equal to 0 volt. During the period $t_0$–$t_3$, electrons produced by the incident light applied between time $t_1$ and time $t_2$ are accumulated in the N+-type light-charge converter region 101, and so the potential $\psi_{N+}$ takes a low level 111 (near zero). If the built-in potential of the P-N+ junction between the N+ light-charge converter region 101 and the substrate 100 is represented by $V_C$, then the potential $\psi_{N+}$ can be lowered to $-V_C$. At time $t_3$, when the signal $\phi_{TG}$ is turned ON, the potential $\psi_{TG}$ rises to the high level 119. At this moment, the potential $\psi_{CCD}$ is at the level 120 which is higher than the level 119. A part of the electrons accumulated in the N+ light-charge converter region 101 is transferred to the CCD charge transfer section via the substrate region directly under the gate electrode 102.

In the initial period of this charge transfer, if the difference between the Fermi level and the intrinsic Fermi level of the substrate is represented by $\phi_{FP}$, then the following relationship is satisfied:

$$\psi_{TG} \geq \psi_{N+} + 2\phi_{FP} \quad (1)$$

Therefore, the transfer is effected under a strong-inversion of the gate region. When the potential at the N+ light-charge converter region has risen as a result of such transfer, the potential relation changes to the following relationship:

$$\psi_{TG} < \psi_{N+} + 2\phi_{FP} \quad (2)$$

and so, the transfer is effected under a weak-inversion of the gate region. Thus, at time $t_4$, the potential $\psi_{N+}$ takes the level 112. It is to be noted that the difference between the levels 119 and 111 is larger than the value $2\phi_{FP}$, and the difference between the levels 119 and 112 is smaller than the value $2\phi_{FP}$.

During the period of time $t_4$ to time $t_5$, the pulse signal $\phi_{TG}$ is in an OFF condition. The potential at the N+ light-charge converter region 101 does not vary. However, the charge transferred to the substrate region directly under the accumulation region electrode 104 in the charge transfer section is transferred along the charge transfer section to the horizontal shift register section 121. Then, it is transferred along the horizontal shift register section 121 to the charge-voltage converter section 122. Finally, it is read out of the charge-voltage converter section 122 as a voltage output.

As a result, during the period between time $t_3$ and time $t_4$, when the pulse signal $\phi_{TG}$ is in an ON condition, the charges on the N+ type light-charge converter region 101 cannot be entirely transferred to the charge transfer section. Always, some charges remain on the region 101. When the pulse signal $\phi_{TG}$ is again turned ON during the period between time $t_5$ and time $t_6$, the charges remaining on the N+-type light-charge converter region 101 are gradually transferred to the charge transfer section, again under the weak-inversion of the gate region. Therefore, the potential $\psi_{N+}$ at the light-charge converter region 101 takes the level 113. These transferred charges are also derived as a voltage output from the charge-voltage converter section 122 via the vertical transfer and the horizontal transfer in combination, as described above during the period between time $t_6$ and $t_7$.

When the pulse signal $\phi_{TG}$ is again turned ON during the period between time $t_7$ and $t_8$, the residual charges are likewise gradually transferred from the N+-type light-charge converter region 101 to the CCD charge transfer section. Hence, the potential $\psi_{N+}$ at the N+-type light-charge converter region 101 takes the level 114. As described above, each time the pulse signal $\phi_{TG}$ is turned ON, some electric charges are transferred from the N+-type light-charge converter region 101 to the CCD charge transfer section. As will be seen from the above description, such subsequently transferred charges are produced even if the N+-type light-charge converter region 101 is not irradiated by incident light, and so, such subsequently transferred charges are observed on a picture image as an unsightly image lag.

Figure 3A:
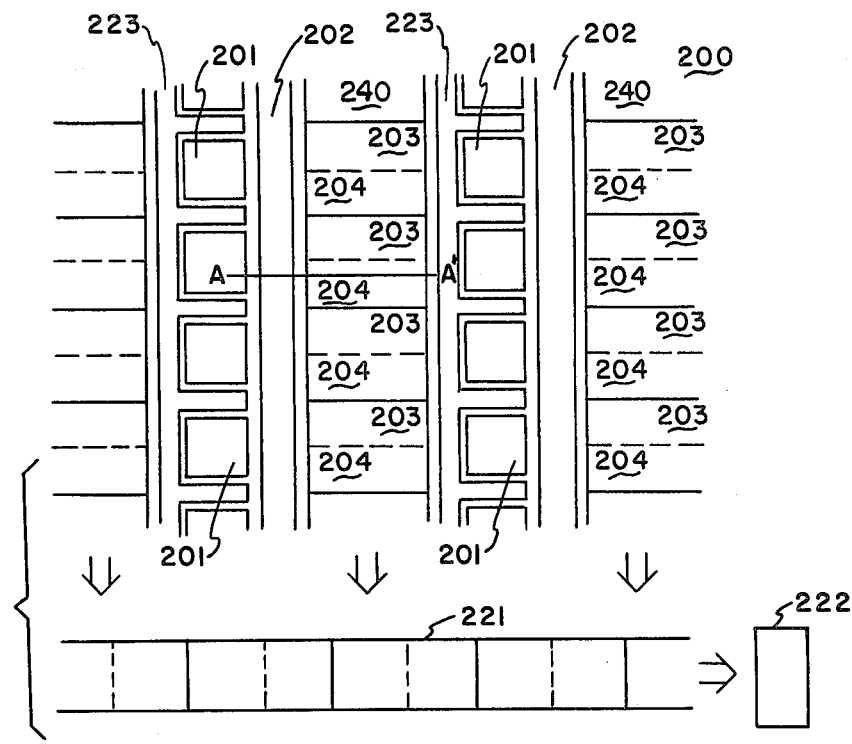
FIG. 3(a) is a schematic plan view for illustrating the construction of the device.
Figure 3B:
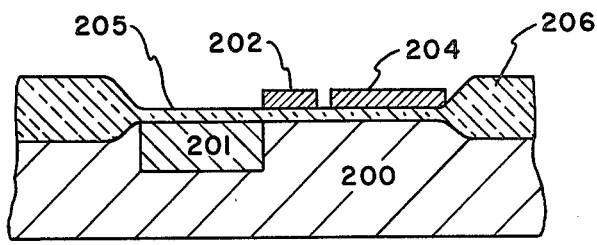
FIG. 3(b) is a cross-sectional view taken along line A—A' in FIG. 3(a)
Figure 3C:
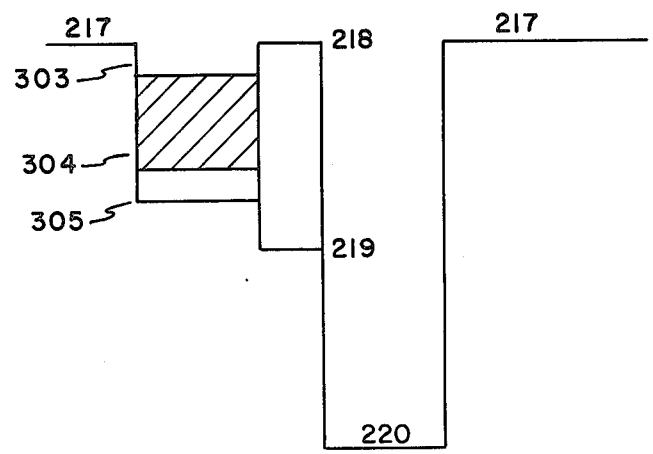
FIG. 3(c) is a diagram showing a potential distribution in a semiconductor substrate portion corresponding to that shown in FIG. 3(b)

FIG. 3 is an illustration of a structure of an interline system CCD area image sensor having a reduced image lag according to a first preferred embodiment of the present invention. FIG. 3(a) is a top view showing an outline of a CCD area image sensor, according to the present invention. FIG. 3(b) is a cross-section view taken along the line A—A' in FIG. 3(a), to show the cross-section of one unit cell. FIG. 3(c) shows a potential profile taken along this cross-section.

In a P-type silicon substrate 200 having an impurity concentration of $1 \times 10^{14}$ to $10 \times 10^{14}$ cm$^{-3}$ are disposed, in a matrix form, N+-type light-charge converter regions 201 having a depth of $5 \times 10^{-2}$ to $20\mu$ and an impurity concentration of $10^{15}$ to $10^{18}$ cm$^{-3}$. The impurity concentration of N+-type light-charge converter regions is higher than that of substrate 200.

Gate electrodes 202 form charge transfer gate sections parallel with the respective columns of these N+-type light-charge converter regions 201. The gate electrode 202 controls the timing for deriving the electric charges accumulated in the N+-type light-charge converter regions 201. Electrode 202 is formed of metal, such as aluminum or the like, on an oxide film 205 of 500 to 2000 Å thickness, as shown in FIG. 3(b). Pulses are applied to gate electrodes 202 with a predetermined pulse height, as defined later from a pulse generator.

The circumference of the N+-type light-charge converter region 201 is surrounded by a channel stopper 223, except for its surface opposed to the accumulation region electrode 204 of the charge transfer section. A thick oxide film or a P+-type high impurity concentration region is employed for the channel stopper 223. Furthermore, in parallel to each gate electrode 202 is a charge transfer section (generally called "vertical shift register"). This charge transfer section is a plurality of electrode pairs formed on the oxide film 205, each pair consisting of two electrodes, 203, 204, as shown in FIGS. 3(a). More particularly, a pair of electrodes comprise an accumulation region electrode 204 and a barrier region electrode 203. The threshold value of the barrier region electrode 203 is higher than that of the accumulation region electrode 204. The difference between the threshold values of these two electrodes can be realized either by increasing the thickness of the oxide film 205 or by enhancing an impurity concentration in the surface portion of the substrate 200. The plurality of electrode pairs are arrayed in one column to form a CCD charge transfer section.

In the charge transfer section, the same pulse signal is applied from the pulse generator to each pair of electrodes. Two-phase pulse signals are generated by the pulse generator and adjacent electrode pairs receive pulse signals of the opposite phases, with respect to each other, so that the electric charges may be transferred along the charge transfer section. The transferred electric charges are given to a horizontal shift register section 221. Each time that electric charges are transferred from the respective charge transfer sections to the horizontal shift register section 221, the horizontal shift register section 221 is emptied by being shifted repeatedly towards a charge-voltage converter section 222. A serial voltage output can be obtained from the charge-voltage converter section 222. Except for the N+-type light-charge converter regions 201, the surface of the imaging device is entirely covered by a light-shielding aluminum film (not shown).

FIG. 3(c) shows a potential profile on the substrate 200 for one unit cell in the above-described embodiment of the present invention. A potential 217 ($\psi_{TP}$) is a potential of the substrate 200 (the ground potential), and a potential 303 or 304 is a potential at the N+-type light-charge converter region 201. The level 303 is the potential when electric charges are accumulated in the region 21. The level 304 is the potential when no charge is present in the region 201.

The level 303 or 304 is represented by $\psi_{TG}$. A level 305 is shown for the purpose of reference. A potential which is more negative than this level 305 is represented at a position which is lower than the level 305 in the potential profile in FIG. 3(c). A transfer of charges from the N+-type light-charge converter region 201 is effected slowly, in the form of "weak-inversion". A potential 218 is the level of the substrate 200 under the gate electrode 202 when a pulse is not applied to the gate electrode 202, and potential 219 is the level of the substrate under the gate electrode when a pulse is applied thereto. The difference between the level 305 and the level 219 is equal to twice the difference between a Fermi level of the region of the substrate 200 directly under the gate electrode 202 and a Fermi level of silicon not containing an impurity. A potential 220 ($\psi_{CCD}$) is the potential of the region of the substrate 200 directly under the accumulation region electrode 204 in the charge transfer section, when a drive pulse is applied to the electrode 204.

Now, the operations of the unit cell will be explained with reference to an application of the pulse signal waveform $\phi_{TG}$ to the gate electrode 202 shown in FIG. 2. In this instance also, it is assumed that the N+-type light-charge converter region 201 in the unit cell is irradiated by incident light only during the period between time $t_3$ and $t_4$. The description will be made principally on a basis of the image lag. During the period between time $t_0$ and time $t_3$, the pulse signal $\phi_{TG}$ is in an OFF condition, and the surface potential of the substrate 200 directly under the gate electrode 202 is held at 0 volt. In this period, when the electrons produced by the incident light during the interval between time $t_1$ and time $t_2$ have accumulated in the N+-type light-charge converter region 201, the potential $\psi_{N+}$ at the N+-type light-charge converter region 201 takes a low level 303. When the pulse signal $\phi_{TG}$ turns ON at time $t_3$, the potential $\psi_{TG}$ rises to a high level 219. Then, the electrons in the N+-type light-charge converter region 201 are transferred through the region directly under the gate electrode 202 to the charge transfer section.

At this moment, by the use of a low donor concentration in the N+-type light-charge converter region 201 such as, for example, $10^{15}$ to $10^{18}$cm$^{-3}$, all of the charges accumulated in the N+-type light-charge converter region 201 can be transferred to the charge transfer section. The N+-type light-charge converter region 201 is then completely depleted and pinched off. The difference between the potential $\psi_{N+}$ (represented by the level 304) and the potential 119 can be any arbitrary large value which is larger than twice the difference between a Fermi level of the region of the substrate 200 directly under the gate electrode 202 and a Fermi level of silicon not containing an impurity. In this instance, in the initial period of the charge transfer from the N+-type light-charge converter region 201 to the CCD charge transfer section, Equation (1) above is fulfilled. Hence, transfer is effected under a strong-inversion state.

As described above, if the impurity concentration in the N+-type light-charge converter region 201 is low, even when the charge accumulated in the N+-type light-charge converter region 201 has been reduced close to 0, the difference between the potential at the N+-type light-charge converter region 201 and the potential at the region directly under the gate electrode 202 is sufficiently large, so that only a short time is required before all of the charges are transferred from the N+-type light-charge converter region 201 to the charge transfer section. The potential at the N+-type light-charge converter section can be easily made to reach the level 304 at time $t_4$.

In other words, even when the charge has disappeared in the N+-type light-charge converter region 201, the potential $\psi_{N+}$(304) is smaller (positioned above as viewed in the potential profile) than the level 305. Therefore, a charge transfer does not occur under the weak-inversion state, as described above in connection with the prior art imaging device. During the period between time $t_4$ and time $t_5$, the pulse signal $\phi_{TG}$ is in an OFF condition, and a charge is not transferred from the N+-type light-charge converter region 201. The charge transferred to the charge transfer section during the period between time $t_3$ and time $t_4$ is read out of the charge-voltage converter section 222 in the form of a voltage output signal.

Even though the signal $\phi_{TG}$ takes an ON condition in the subsequent period between time $t_5$ and time $t_6$, a charge is not present in the N+-type light-charge converter region 201. No charge is transferred from the N+-type light-charge converter region 201 to the charge transfer section, and thus an image lag does not occur.

The above description has explained, with reference to a potential profile within a unit cell, that the after image effect would occur in some cases but would not occur in other cases, depending upon an impurity concentration in a light receiving region.

Now, a description will be made in more detail by explaining how a selection of the impurity concentration in the N+-type light-charge converter region can suppress the after image effect. Assume here a step-like impurity distribution, and represent an acceptor concentration in the P-type silicon substrate 200 by $N_A cm^{-3}$, a donor concentration in the N+-type light-charge converter region 210 by $N_O cm^{-3}$ and a depth of the N+-type light-charge converter region 201 by $X_j$, then a voltage $V_m$ is necessary for depleting the whole N+-type light-charge converter region 201. The voltage $V_m$ is represented by the following equation:

$$V_m = \frac{qN_o(N_o + N_a)}{2 \epsilon s_i N_a} X_j^2 \quad (3)$$

where: q represents a unit of charge, and $\epsilon s_i$ represents a dielectric constant of silicon.

Accordingly, the condition for the image lag not to occur is represented as follows:

$$V_m + 2\phi_{FP} \leq \psi_{TG}(ON), \quad (4)$$

where $\psi_{TG}(ON)$ represents a surface potential of the substrate 200 under the gate electrode 202 when the gate electrode 202 is in an ON condition. This potential is equal to the value obtained by subtracting a threshold value from the potential of the pulse applied to the gate electrode 202. The term $N_{max}$ represents the maximum number of charge units which can be accumulated in the N+-type light-charge converter region 201 (i.e. the maximum number of charge units which can be transferred from the N+-type light-charge converter region 201 to the charge transfer section. $N_{max}$ is represented by the following equation:

$$N_{max} = N_o X_j S_N \quad (5)$$

where $S_N$ is an area of one of the N+-type light-charge converter region 201.

Here, the conditions are described for preventing an image lag and for placing the CCD imaging device in an appropriate operation range. The relationship of the equation (4) should be fulfilled and the number $N_{max}$ is sufficiently large for obtaining a signal-to-noise ratio S/N of 60-70 dB or higher. In practical use, the voltage applied to the gate electrode 202 is limited by the breakdown voltages of the oxide film 205 and by the PN junction which is formed in the circuit (not shown) for processing the output of the charge-voltage converter 222. Since this limit of the voltage is 30 volts, the equation (4) can be replaced by the following equation (4'):

$$V_m + 2\phi_{FP} \leq 30 \text{ volts} \quad (4)$$

Assume now the numerical values of $N_A = 5 \times 10^{14}$ $cm^{-3}$, $N_O = 2.0 \times 10^{15}$ $cm^{-3}$ and $X_j = 1$ $\mu m$, then the values of $V_m = 7.5$ volts and $2\phi_{FP} = 0.5$ volts can be obtained. Hence, the relationship (4) can be fully satisfied. In addition, for the value of $S_N$, a sufficiently small value $S_N = (15 \mu m)^2$ produces a two-dimensional image sensor, and an easily achievable number of noise electrons is a value of $10^2$ per charge packet. Then, $N_{max} = 4.5 \times 10^5$ and S/N =

$$\frac{4.5 \times 10^5}{10^2} = 4.5 \times 10^3$$

can be obtained as a result of calculations. Hence, it is seen that a signal-to-noise ratio S/N of 70 dB or higher can be obtained. As will be obvious from the above explanation, if the impurity concentration in the N+-type light-charge converter region 201 is appropriately selected, an image lag can be eliminated and a sufficiently high signal-to-noise ratio can be realized.

Figure 4:
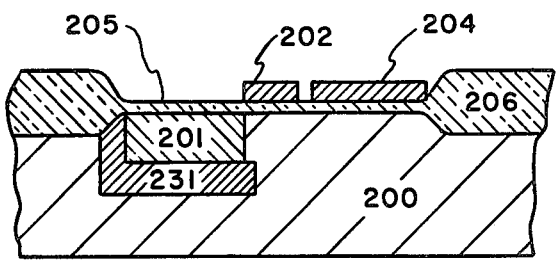
FIG. 4 is a cross-sectional view of one unit cell showing a modification of the first preferred embodiment of the present invention.

FIG. 4 shows a modification of the first preferred embodiment of the present invention illustrated in FIGS. 3(a), 3(b) and 3(c). In this figure portions which are equivalent to those shown in FIGS. 3(a), 3(b) and 3(c) are denoted by like reference numerals. The only difference from the structure shown in FIGS. 3(a), 3(b) and 3(c) resides in that a P+-type region 231 is provided along the lower surfaces of the N+-type light-charge converter regions 201. When the acceptor impurity concentration in this P+-type region 201 is raised, even if the donor impurity concentration in the N+-type light-charge converter region 201 is increased, it is possible to sufficiently pinch off the N+-type light-charge converter region 201. On the other hand, when the down impurity concentration in the N+-type light-charge converter region 201 is held at a fixed value, the voltage $V_m$ is lowered to completely deplete the N+-type light-charge converter region 201. The lowering occurs, owing to the existence of this P+-type region 231. By lowering this voltage $V_m$, the maximum number $N_{max}$ of charge units, which can be accumulated in the N+-type light-charge converter region 201 as represented by Equation (5) above, can be increased.

Moreover, in this modified structure, electrons produced by incident light in the P-type substrate 200, under the P+-type region 23$^1$, are repelled by a built-in electric field in the P-P+ junction between these regions. These electrons cannot enter the N+ light-charge converter region 201. The P+-type region 231 is also effective for preventing both a reduction of a photo-sensitivity for a long-wavelength of light and a deterioration of resolution.

Figure 5A:
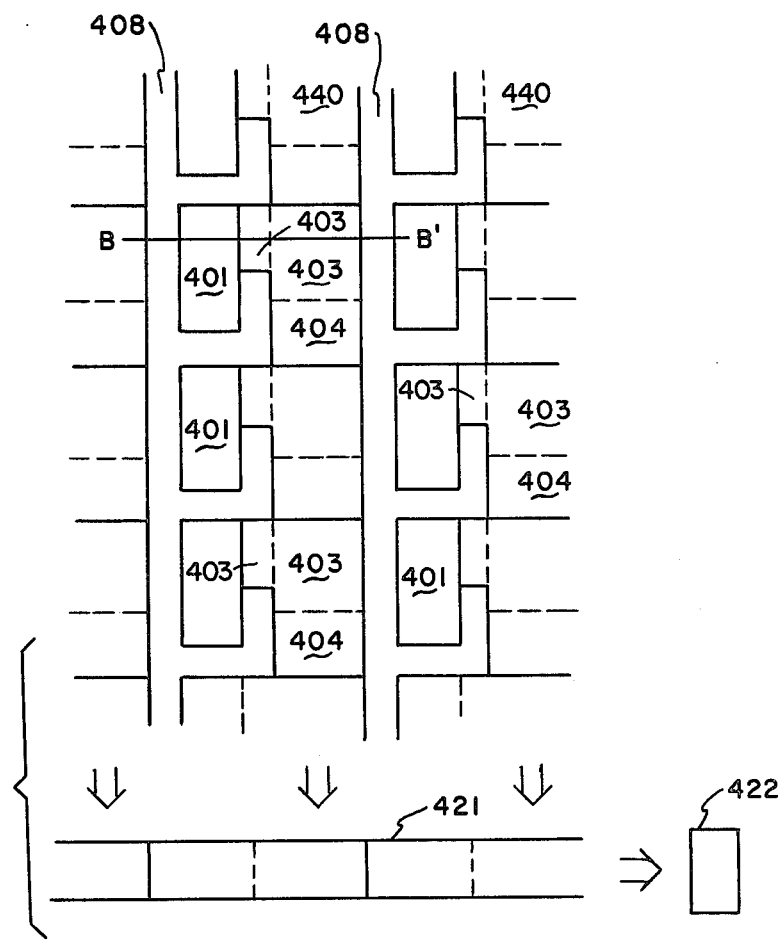
FIG. 5(a) is a schematic plan view for illustrating the construction of the device.
Figure 5B:
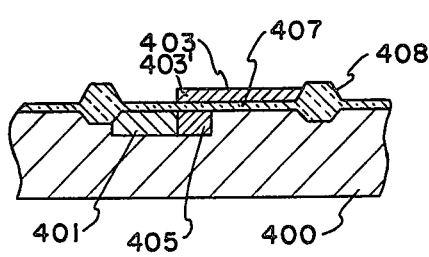
FIG. 5(b) is a cross-sectional view taken along line B—B' in FIG. 5(a)
Figure 5C:
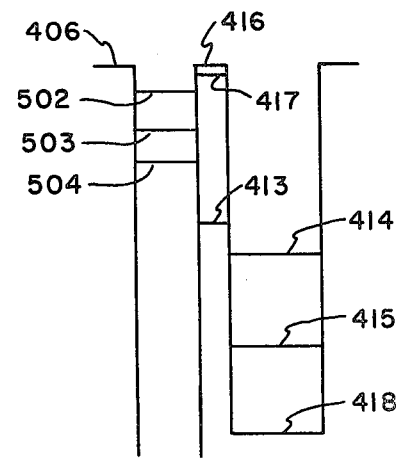
FIG. 5(c) is a diagram showing a potential distribution in a semiconductor substrate portion corresponding to that shown in FIG. 5(b)

FIGS. 5(a), 5(b) and 5(c) illustrate a second preferred embodiment of the present invention. The gate electrode 102 in the first preferred embodiment is replaced by a continuously formed electrode, with an accumulation region electrode 403 in a charge transfer section. More particularly, FIG. 5(a) is a schematic illustration of an interline system CCD area image sensor. FIG. 5(b) is a cross-section view taken along line B-B' in FIG. 5(a) to show the structure of one unit cell in the image sensor.

In this second preferred embodiment, a plurality of N+-type light-charge converter regions 401 are provided in a matrix form within a P-type silicon substrate 400 having an impurity concentration of 1 to $10 \times 10^{14}$ cm$^{-3}$. The N+-type light-charge converter regions 401 are formed to a depth of $5 \times 10^{-2}$ to 20 m and an impurity concentration of $10^{15}$ to $10^{18}$ cm$^{-3}$. The impurity concentration of the light-charge converter regions 401 is higher than that of substrate 400. Charge transfer sections are formed along and parallel with the respective columns of N+-type light-charge converter regions 401. The charge transfer section is formed of a plurality of electrode pairs coupled to each other, each pair consisting of a charge accumulation region electrode 403 and a barrier region electrode 404. These charge accumulation region electrodes 403 and barrier region electrodes 404 are all disposed on an oxide film 407 of 500–2000 Å thickness, the film being coated on the substrate 400.

The same pulse signal is applied from a pulse generator to the charge accumulation region electrode 403 and the barrier region electrode 404, in one electrode pair. To adjacent electrode pairs are applied pulse signals having phases which are opposite to each other, in order to carry out charge transfer. Similar to the first preferred embodiment, the threshold value of the charge accumulation region electrode 403 is made lower than the charge threshold region of the barrier region electrode 404. The threshold value of the charge accumulation region electrode 403 is made higher at the portion adjacent to the light-charge converter region 401 than at the other portion. The circumference of the N+-type light-charge converter region 401 is surrounded by a thick oxide film 408, except for the face opposed to the charge accumulation region electrode 403.

Figure 6:
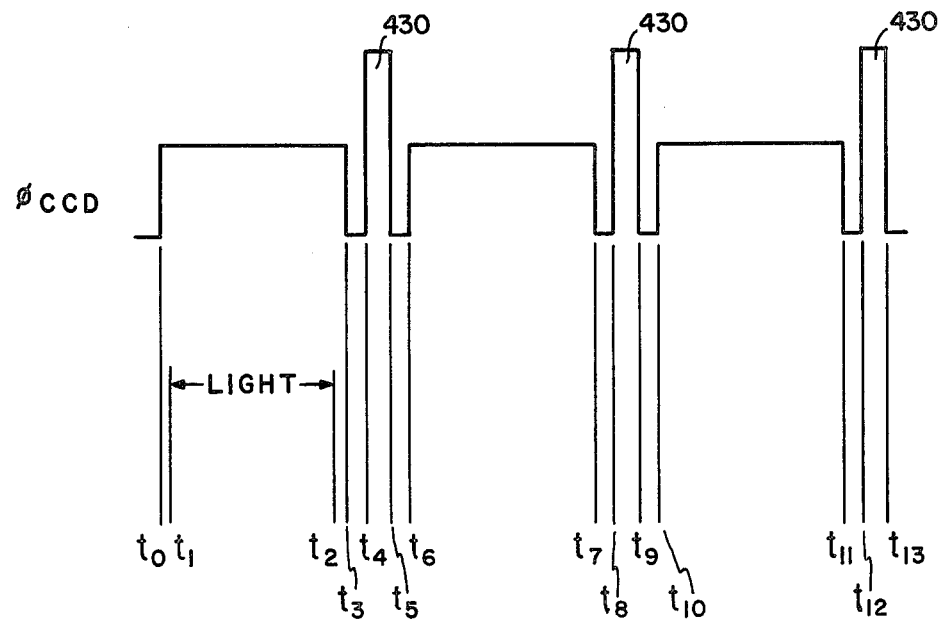
FIG. 6 is a time chart showing a pulse waveform applied to a charge transfer section in the second preferred embodiment of the present invention.

High voltage pulses 430 are supplied from the above-mentioned pulse generator, at a fixed time interval, as shown in FIG. 6. In response to this high voltage pulse 430, the N+-type light-charge converter region 401 and the region directly under the charge accumulation region electrode 403 are connected via a channel, so that the charges accumulated in the N+-type light-charge converter region 401 are transferred to the region directly under the charge accumulation region electrode 403, in the charge transfer section.

At this moment, the once transferred charges do not return to the N+-type light-charge converter region 401, because the threshold value of the portion of the region directly under the charge accumulation region electrode 403, adjacent to the N+-type light-charge converter region 401, is higher than the threshold value of the remaining portion of the same region under the charge accumulation electrode 403, as mentioned above. This enhancement of the threshold value is achieved by forming a P+-type region 405 as shown in FIG. 5(b). After the transferred charges have been further transferred along the charge transfer section towards a horizontal shift register section 421, and then along the horizontal shift register section 421 to a charge-voltage converter section 422, a voltage output signal is derived from the charge-voltage converter section 422.

FIG. 5(c) shows a potential profile on the substrate 400 for the unit cell illustrated in FIG. 5(b). Level 502 is the potential at the N+-type light-charge converter region 401 when charges have been accumulated therein. Level 503 is the potential at the N-type light-charge converter region 401 when charges are not present therein. These levels 502 or 503 are hereinafter individually represented by $\psi_{N+}$.

Level 504 is the potential at the N+-type light-charge converter region 401 when the charge transfer from this region is effected under the weak inversion state. These charge transfer potentials are illustrated in FIG. 5(c), for the purpose of reference. Levels 413 to 418 are potentials in the region under the charge accumulation region electrode 403. The region under the charge accumulation region electrode 403 has a higher threshold value in the portion adjacent to the N+-type light-charge converter region 401 than that in the remaining portion. Therefore, the pairs of different levels 416–414, 417–415 and 413–418 represent different potentials in the respective portions at same moments. More particularly, the levels 416 and 414 are the potentials at the respective portions when no pulse voltage is applied to the charge accumulation region electrode 403. The levels 417 and 415 are the potentials at the respective portions when the pulse for effecting charge transfer along the charge transfer section is applied to the charge accumulation region electrode 403. The levels 413 and 418 are the potentials at the respective portions when the pulse 430 is applied for deriving electric charges from the N+-type light-charge converter region 401 to the charge accumulation region electrode 403. In the following description, the level 416, 417 or 413 is represented by $\psi_{P+}$, and the level 414, 415 or 418 is represented by $\psi_{CCD}$.

FIG. 6 shows pulses ($\phi_{CCD}$, 430) applied to the charge transfer section. During the time periods $t_0$ to $t_3$, $t_6$ to $t_7$, $t_{10}$ to $t_{11}$, there are a large number of pulses for effecting the charge transfer along the charge transfer section. These pulses are applied to the charge transfer section. (Although a continuous high level is indicated symbolically in each of these periods, in reality a large number of pulses are included in each period). During the time periods $t_4$ to $t_5$, $t_8$ to $t_9$ and $t_{12}$ to $t_{13}$, pulses 430 are applied to the charge accumulation region electrode 403 for deriving electric charges from the N+-type light-charge converter region 401 in the charge transfer section. The pulse height of these pulses 430 is higher than the pulse height of the charge transfer pulses applied during the periods of time $t_0$ to $t_3$, $t_6$ to $t_7$ and $t_{10}$ to $t_{11}$.

Now the operations of the second preferred embodiment will be explained, assuming that the image sensor is irradiated with the incident light only during the period between time $t_1$ and time $t_2$ (FIG. 6). When the charges produced by the incident light during the period of time $t_1$–$t_2$ have accumulated in the N+-type light-charge converter region 401 (FIG. 5), the potential $\psi_{N+}$ takes a low level 502. When the pulse signal $\phi_{CCD}$ (FIG. 6) takes a high level in the period of time $t_4$–$t_5$, the levels $\psi_{P+}$ and $\psi_{CCD}$ also rise and fulfill the relationship of $\psi_{N+} < \psi_{P+} < \psi_{CCD}$. Thus, the electric charges accumulated in the N+-type light-charge converter region 401 (FIG. 5) are transferred via the P+-type region 405 to the charge transfer section.

If the impurity concentration in the N+-type light-charge converter region 401 is small or is $10^{15}$ to $10^{18}$ cm$^{-3}$, then all the charges are transferred from the N+-type light-charge converter region 401 to the charge transfer section. Hence, the N+-type light-charge converter region 401 is completely depleted and brought to a pinch-off condition. The difference between the potential $\psi_{N+}$ at this moment (indicated as a level 503) and the level 413 can be any arbitrary magnitude which is larger than twice the difference between a Fermi level of the P+-type region 405 adjacent to the N+-type light-charge converter region 401 and a Fermi level of silicon which does not contain an impurity.

In this instance, initially the charge transfer from the N+-type light-charge converter region 401 to the charge transfer section is carried out under a strong-inversion of the P+-type region 405. Moreover, if the charges in the N+-type light-charge converter region 401 are reduced, as a result of the charge transfer, the potential at the region 401 rises, since the P+-type region can maintain a strong-inversion state. The time required for all the charges to be transferred from the N+-type light-charge converter region 401 to the substrate region directly under the charge accumulation region electrode 403 of the charge transfer section is very short.

At time $t_5$ (FIG. 6), the potential $\psi_{N+}$ can reach the level 503 corresponding to the state where all of the accumulated charges have been transferred to the charge transfer section. In the illustrated case, the level 503 (FIG. 5) is smaller in magnitude than the level 504 at which the charge transfer changes the strong-inversion type to the weak-inversion type. The charge transfer under a weak-inversion state, as explained previously with reference to FIG. 1, would not occur.

During the period between time $t_6$ and time 7 (FIG. 6), the relationship of $\psi_{N+} > \psi_{P+}$ is fulfilled, and charge transfer from the N+-type light-charge converter region 401 (FIG. 5) to the charge transfer section does not occur. The charges transferred to the charge transfer section during the period between time $t_4$ and time $t_5$ are transferred along the charge transfer section and further along the horizontal shift register section 421 to the charge-voltage converter section 422. The read out of the charge voltage converter section 422 is in the form of a voltage output signal. Subsequently, even though the pulse signal $\phi_{CCD}$ takes a high level during the period between time $t_8$ and time $t_9$, and since no charge is present in the N+-type light-charge converter region 401, no charges are transferred from the N+-type light-charge converter region 401 to the charge transfer section and hence an image lag does not appear.

Figure 7:
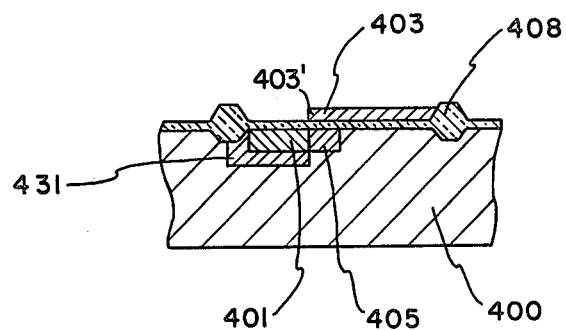
FIG. 7 is a cross-sectional view of one unit cell showing a modification of the second preferred embodiment of the present invention.

With regard to the voltage $V_m$ required for completely depleting the N+-type light-charge converter region 401 and the maximum number of charge units $N_{max}$ that can be accumulated in the N+-type light-charge converter region 401, the analysis is the same as that made in connection to the first preferred embodiment and can be made in a similar manner. In the practical case, the equation (4) can be similarly replaced by the equation (4'). In addition, as with the modification to the first preferred embodiment, as described above with reference to FIG. 4, the voltage $V_m$ for depleting the N+-type light-charge converter region 401 can be lowered by providing a P+-type region 431 between the N+-type light-charge converter region 401 and the P-type silicon substrate 400, as shown in FIG. 7.

Figure 8:
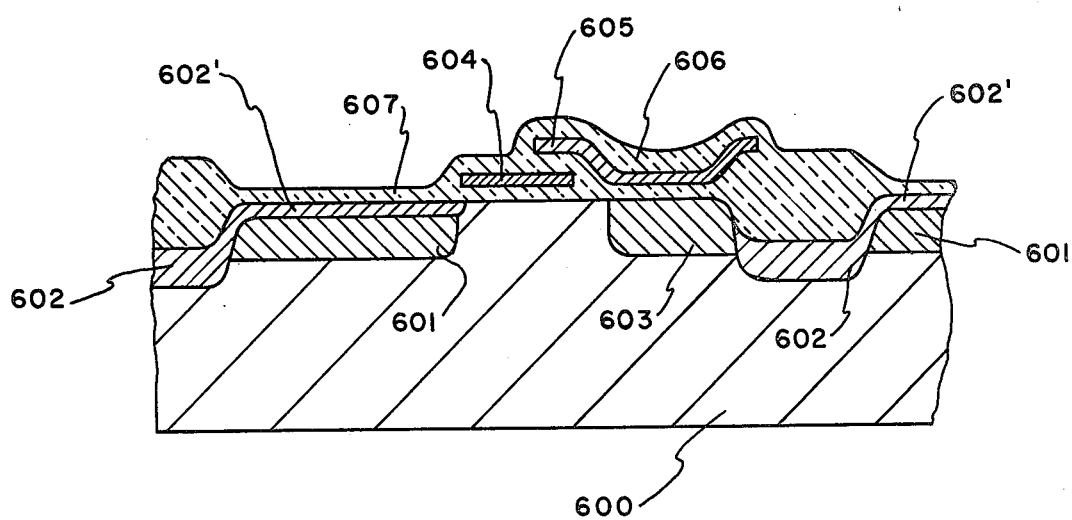
FIG. 8 is a cross-sectional view of one unit cell showing a third preferred embodiment of the present invention.

FIG. 8 shows a third and preferred embodiment of the present invention. A plan view of the CCD image sensor according to the third preferred embodiment is similar to that of the first preferred embodiment shown in FIG. 3(a). A structure of one unit cell of the image sensor is shown in cross-section in FIG. 8.

A P-type substrate 600 has an impurity concentration of 1 to $10 \times 10^{14}$ cm$^{-3}$ (for instance, $4 \times 10^{14}$ cm$^{-3}$). A N-type region 601 is formed with an impurity concentration of $10^{15}$ to $10^{18}$ cm$^{-3}$ (for instance, $10^f$ cm$^{-3}$) and a depth of $5 \times 10^{-2}$ to 20 μm (for instance, 0.55 μm) to serve as a light-charge converter region. Such N-type regions 601 are formed in multiple and arrayed in a matrix form. A P+-type region 602 having an impurity concentration of $4.5 \times 10^{17}$ cm$^{-3}$ is formed as a channel stopper (equivalent to the channel stopper 223 in FIG. 3(a)). This P+-type region 602 has an extension 602' of 0.8 μm thickness, along the top surface of the N-type region 601. On an oxide film 607 is formed a gate electrode 604 of p polycrystalline silicon. Further, an electrode 605 of polycrystalline silicon is also formed in a charge transfer section thereon. The gate electrode 604 is formed along a column of N-type regions 601 in parallel thereto, and the charge transfer section is also provided in parallel thereto. The charge transfer section is composed of charge accumulation region electrodes and barrier region electrodes, similar to the first and second preferred embodiments. The illustrated electrode 605 is one of the charge accumulation region electrodes. In the surface portion of the P-type substrate 600, in the charge transfer section, is formed an N-type region 603 so that charge transfer may be carried out through a burried channel. Besides, as in the first and second preferred embodiments, a horizontal shift register section and a charge-voltage converter section are formed in the same substrate 600. A light shielding aluminum layer (not shown) covers over the entire surface except for the surface of the N-type region 601 and the P+-type extension region 602'.

The solid-state imaging device having a reduced image lag, according to the third preferred embodiment, has a lower donor concentration in the N-type region 601 as compared to the concentration in the conventional imaging device. An extension 602' of the P+-type region is provided over the entire top surface of the N-type region 601. Consequently, the back bias voltage $V_{DEP}$ is required for completely depleting the N-type region 601. Hence, the value of $V_{DEP} + 2V_F$ is smaller than the highest voltage, 30 V in the conventional MOS integrated circuits. (The voltage $V_F$ represents a difference between a Fermi level of the P-type substrate 600 and a Fermi level of silicon not containing an impurity). Since the relationship of $V_{DEP} + 2V_F < 30$ volts is fulfilled, the potential $V_{ch}$ at the substrate 600 directly under the gate electrode 604 can be easily made higher than $V_{DEP} + 2V_F$ when a transfer pulse is applied to the gate electrode 604. According to this preferred embodiment, the relation of $V_{ch} > V_{DEP} + 2V_F$ is always fulfilled; therefore, signal charges can always be transferred at a high speed from the N-type region 601 to the region directly under the electrode 605, in the charge transfer section.

For instance, in the case where the channel length of the gate electrode 604 is 5 μm, the channel width is 5 μm, and the capacitance of the N-type region 601 is 0.03 pF, a time interval of no more than 100 nsec. is required for completely transferring charges accumulated in the N-type region 601, the charges being up to about 2 volts. This 100 nsec. period is very short as compared to the time interval which is required when the transfer gate is held ON, a time interval which is equal to about 1 μsec to about 5 μsec. As a result, signal charges can be completely transferred from the N-type region 601 to the region under the electrode 605 with no signal charge left in the N-type region 601, and so, an image lag does not occur.

Figure 9:
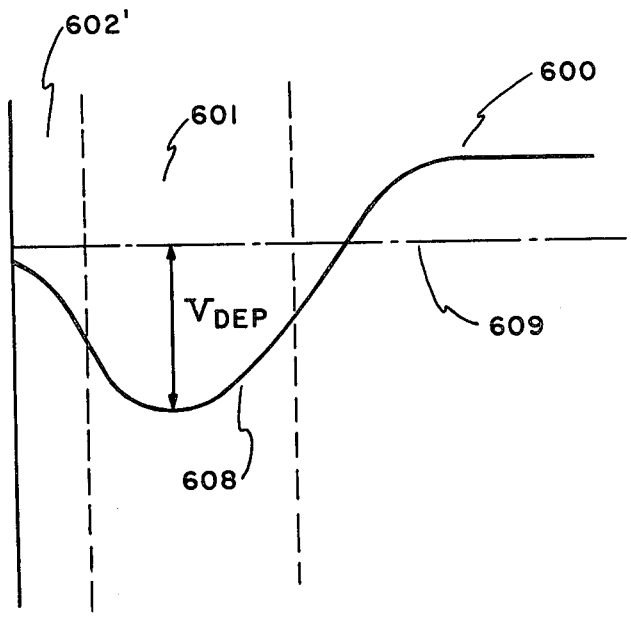
FIGS. 9 and 10 are diagrams showing potential distributions to be referred to for explaining the operations of the third preferred embodiment of the present invention.
Figure 10:
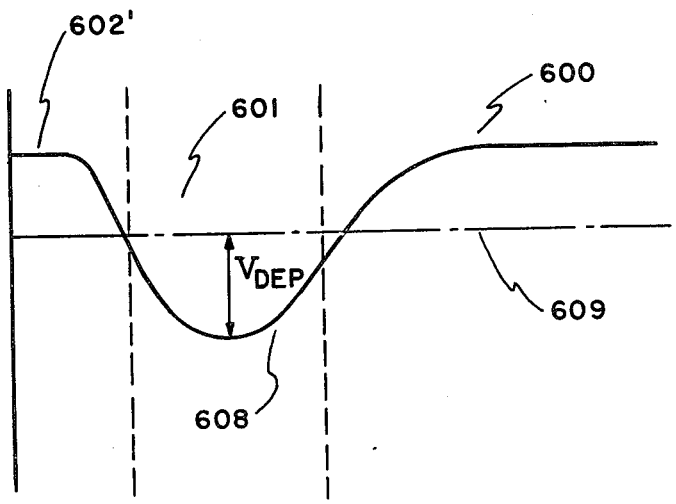

Now a description will be made of the effect of the P+-type surface layer 602', which extends over the entire top surface of the N-type region 601. FIGS. 9 and 10 illustrate potential distributions in the P+-type extension 602', N-type region 601 and P-type substrate 600 according to the third preferred embodiment. The potential distribution is taken along the direction perpendicular to the surface of the imaging device, respectively. FIG. 9 is taken with respect to the case where the surface layer 602' can be depleted, and FIG. 10 is taken with respect to the case where the surface layer 602' is not depleted. The left side end of each Figure is the potential at the surface of the imaging device, and the P+-type surface layer 602', N-type region 601 and P-type substrate 600 are represented sequentially as the curve moves from the surface potential on the left towards the right side. A solid line curve 608 represents a distribution of potential as sensed by electrons. A dash-dot line 609 represents a Fermi level in an undepleted region within the P-type substrate 600, which level is used as a reference potential. These figures both represent the case where the N-type region 601 has been completely depleted. However, FIG. 9 shows the case where an acceptor concentration in the surface layer 602' is small and hence the surface layer 602' also has been completely depleted, whereas FIG. 10 shows the case where the proximity of the surface in the surface layer 602' is not depleted. In FIG. 10, the potential at the undepleted portion of the surface layer 602' is equal to the potential at the undepleted region within the substrate 600.

A first effect of the surface layer 602' is, as described previously, to reduce the voltage $V_{DEP}$ which can completely deplete the N-type region 601. In this case, the voltage $V_{DEP}$ can be reduced owing to the fact that the N-type region 601 makes a P-N junction not only with the P-type substrate 600 but also with the P+-type surface layer 602', and hence a depletion layer is expanded from the both P-N junctions.

A second effect of the surface layer 602' is that, as the maximum point of potential is not located at the boundary between silicon and an oxide film 607 provided on silicon, signal charges do not contact the boundary. Consequently, the signal charge is not captured by traps distributed in the neighborhood of the boundary. Hence, an image lag due to the traps would not occur.

Moreover, in the case of the potential distribution shown in FIG. 10, there is an additional advantage that there is little or no influence of stray charges in the oxide film on the surface of the device or on the surface of the oxide film. These areas are shielded by the undepleted surface portion in the surface layer 602'. Hence, stray charges do not affect the N-type region 601. Therefore, fluctuations in characteristics are reduced among lots or among devices. Further, since the boundary between oxide film 607 and the P+-type extension 602' does not deplete, the leakage current flowing through the boundary is very small.

While the present invention has been described above in connection to various embodiments thereof, the invention is equally applicable to MOS+CCD type two-dimensional solid-state imaging devices or MOS+BBD type two-dimensional solid-state imaging devices, in which signal lines are used as vertical signal charge transfer means. These signal lines are connected via one or a plurality of MOSFET's to a horizontal CCD register or a horizontal backet brigade (BBD) register which serve as horizontal signal charge transfer means. In addition, the present invention is applicable not only to a two-dimensional solid-state imaging device but also to a one-dimensional solid-state imaging device.

The invention has been described above in connection with preferred embodiments of the N-channel type. In the case of P-channel type, it is only necessary to interchange the P and N conductivity types in the above description and in the drawings. For instance, a voltage with an absolute value is normally used for the back bias voltage between the accumulation region and the substrate or the difference between the Fermi level of the channel portion in the transfer gate and the intrinsic Fermi level. Since such an absolute value is normally used, in the case of the P-channel type, the voltage having the same absolute value but opposite polarity is employed. With regard to the channel potential of the transfer gate with reference to the Fermi level of the undepleted portion within the substrate, since it is positive in the case of N-channel type but negative in the case of P-channel type, an absolute value of the channel potential is employed. Furthermore, the charge transfer section could be either a surface channel type or a buried channel type.

What is claimed is:

1. The solid-state imaging device comprising a semiconductor substrate of one conductivity type having an impurity concentration in the order of 1 to $10 \times 10^{14}$ cm$^{-3}$, a plurality of light-charge converter regions of the other conductivity type having an impurity concentration of $10^{15}$ to $10^{18}$ cm$^{-3}$, said light-charge converter regions being arrayed in a matrix form of rows and columns, a plurality of surface regions of said one conductivity type having an impurity concentration which is higher than the impurity concentration of said light-charge converter regions, said surface regions being disposed at the surface of said light-charge converter regions, charge transfer gate sections disposed parallel to columns of said light-charge converter regions, CCD charge transfer sections disposed parallel to said charge transfer gate sections, shift register means for receiving charges from said CCD charge transfer sections, and charge-voltage converter means for deriving a voltage signal in response to quantities of charges transferred along said shift register.

* * * * *